United States Patent
Rohde et al.

(10) Patent No.: US 8,824,034 B2
(45) Date of Patent: Sep. 2, 2014

(54) METHOD OF OPERATING A LASER IN AN OPTICAL COMPONENT, OPTICAL COMPONENT, AND OPTICAL COMMUNICATION SYSTEM

(75) Inventors: Harald Rohde, Munich (DE); Thomas Treyer, Munich (DE); Sylvia Smolorz, Mountain View, CA (US); Erich Gottwald, Holzkirchen (DE)

(73) Assignee: Xieon Networks S.a.r.l., Luxembourg (LU)

(*) Notice: Subject to any disclaimer, the term of this patent is extended or adjusted under 35 U.S.C. 154(b) by 160 days.

(21) Appl. No.: 13/395,529

(22) PCT Filed: Sep. 11, 2009

(86) PCT No.: PCT/EP2009/061800
§ 371 (c)(1),
(2), (4) Date: Mar. 16, 2012

(87) PCT Pub. No.: WO2011/029478
PCT Pub. Date: Mar. 17, 2011

(65) Prior Publication Data
US 2012/0170092 A1    Jul. 5, 2012

(51) Int. Cl.
*G02B 26/08* (2006.01)
*H04B 10/60* (2013.01)
*H01S 3/105* (2006.01)
*H01S 5/14* (2006.01)
*H01S 3/106* (2006.01)
*H01S 5/062* (2006.01)

(52) U.S. Cl.
CPC ............ *H04B 10/60* (2013.01); *H01S 3/105* (2013.01); *H01S 5/141* (2013.01); *H01S 3/1062* (2013.01); *H01S 5/062* (2013.01)
USPC ........................................... 359/196.1

(58) Field of Classification Search
CPC .......................................... G02B 27/48
USPC .......................................... 359/196.1; 398/33
See application file for complete search history.

(56) References Cited

U.S. PATENT DOCUMENTS

| 5,200,964 A | 4/1993 | Huber |
| 5,473,625 A | 12/1995 | Hansen et al. |
| 2005/0031343 A1* | 2/2005 | Stephens et al. ........... 398/33 |

FOREIGN PATENT DOCUMENTS

| EP | 0 503 579 A2 | 9/1992 |
| WO | 00/69039 A1 | 11/2000 |

OTHER PUBLICATIONS

International Search Report of PCT/EP2009/061800, Dated Jun. 2, 2010.
Fernando et al. "Optical carrier synthesis in coherent lightwave systems" Jan. 1991, pp. 12/1-12/7, XP006523411.

* cited by examiner

*Primary Examiner* — Euncha Cherry
(74) *Attorney, Agent, or Firm* — Nelson Mullins Riley & Scarborough LLP

(57) ABSTRACT

A method and a device for operating a laser in an optical component are provided, wherein the laser is a local oscillator of the optical component; and wherein a linewidth of the laser is broadened. Furthermore, an optical communication system is suggested comprising said optical component.

16 Claims, 6 Drawing Sheets ated by the network service providers worldwide. Conventional PONS distribute downstream traffic from the optical

METHOD OF OPERATING A LASER IN AN OPTICAL COMPONENT, OPTICAL COMPONENT, AND OPTICAL COMMUNICATION SYSTEM

BACKGROUND OF THE INVENTION

Field of the Invention

The invention relates to a method and to a device for operating a laser in an optical component.

A passive optical network (PON) is a promising approach regarding fiber-to-the-home (FTTH), fiber-to-the-business (FTTB) and fiber-to-the-curb (FTTC) scenarios, in particular as it overcomes the economic limitations of traditional point-to-point solutions.

The PON has been standardized and it is currently being deployed by network service providers worldwide. Conventional PONS distribute downstream traffic from the optical line terminal (OLT) to optical network units (ONUs) in a broadcast manner while the ONUs send upstream data packets multiplexed in time to the OLT. Hence, communication among the ONUs needs to be conveyed through the OLT involving electronic processing such as buffering and/or scheduling, which results in latency and degrades the throughput of the network.

In fiber-optic communications, wavelength-division multiplexing (WDM) is a technology which multiplexes multiple optical carrier signals on a single optical fiber by using different wavelengths (colors) of laser light to carry different signals. This allows for a multiplication in capacity, in addition to enabling bidirectional communications over one strand of fiber.

WDM systems are divided into different wavelength patterns, conventional or coarse and dense WDM. WDM systems provide, e.g., up to 16 channels in the 3rd transmission window (C-band) of silica fibers around 1550 nm. Dense WDM uses the same transmission window but with denser channel spacing. Channel plans vary, but a typical system may use 40 channels at 100 GHz spacing or 80 channels with 50 GHz spacing. Some technologies are capable of 25 GHz spacing. Amplification options enable the extension of the usable wavelengths to the L-band, more or less doubling these numbers.

Optical access networks, e.g., a coherent Ultra-Dense Wavelength Division Multiplex (UDWDM) network, are deemed to be the future data access technology.

Within the UDWDM concept, potentially all wavelengths are routed to each ONU. The respective wavelength is selected by the tuning of the local oscillator (LO) laser at the ONU.

Hence, the UDWDM system uses a tunable LO laser with a coherent receiver to select one of a multitude of downstream wavelengths. Upon start-up of the system, the correct wavelength is unknown and needs to be found by scanning for permissible wavelengths.

Within such UDWDM OAN a detection of downstream wavelengths from the OLT at the ONU site may be difficult. It can be done by processing a scan of the ONU's local oscillator over the whole wavelength range. As the width of the laser is rather small compared to the whole wavelength range and as the local oscillator laser and the downstream wavelength need to be nearly identical, such scan process requires a significant amount of time during which the local oscillator crosses the wavelength range in very small steps.

Coherent receivers use narrowband lasers as local oscillators. The permissible maximum linewidth of the laser depends on the permissible bit error rate (BER) of the communications system, the data rate, and the modulation format. For example, a maximum linewidth of the laser may amount to (less than) 1 MHz.

The coherent receiver detects a DC signal that is proportional to the total power of the local oscillator laser and the communication wavelengths impinging on the receiver together with an AC component. The DC component is independent of the frequency difference between the local oscillator (LO) laser's wavelength and the communication wavelengths and is filtered out before the data is processed any further. The AC component appears at a frequency which is the difference between the frequency of the LO laser and the frequency of the communication channel. The strength and the intensities of this AC component is proportional to a spectral overlap of the two lasers.

The AC signal can be detected when the frequency difference is small enough to be within the bandwidth of the detection electronics and if the overlap persists long enough to make up a sizable fraction of the detection system's time constant.

Since both lasers (the LO laser at the ONU and the laser at the OLT used for conveying information towards the ONU) may have a typical linewidth of, e.g., 1 MHz, and a typical communications band such as the C-band spans several THz, a wavelength scan would yield a signal only for a millionth of the possible scan positions, if the scan is performed in steps of the linewidth. The system would have to remain in each step long enough for the signal to register. Assuming that it takes a millisecond to register the overlap and stop the scanning, this would lead to a scan time of about 1000 s in order to find a channel. This time will even increase if information included in the channel (such as its availability) needs to be evaluated.

It is expected that initially, the channel plan is sparsely used in order not to waste power on unused channels. Hence, most of the scan time would yield no signal at all, but since the scanning needs a certain time to detect the lack of a channel, unused spectrum will require nearly the same amount of scan time as used spectrum.

BRIEF SUMMARY OF THE INVENTION

The problem to be solved is to overcome the disadvantages described above and in particular to suggest a mechanism that allows speeding up a scanning process at an optical component.

This problem is solved according to the features of the independent claims. Further embodiments result from the depending claims.

In order to overcome this problem, a method is provided for operating a laser in an optical component
  wherein the laser is a local oscillator of the optical component;
  wherein a linewidth of the laser is broadened.

It is noted that the linewidth of the laser may be a spectrum, a frequency range or a wavelength range of the laser. By broadening the laser's wavelength, the scanning process for a wavelength received at the optical component can be significantly accelerated as the laser's small linewidth does not have to scan a huge range of wavelengths for the incoming signal.

In an embodiment, an incoming signal is scanned utilizing the broadened linewidth of the laser.

Such scanning of the incoming signal may in particular utilize determining a wavelength of the incoming signal. The laser's wavelength is preferably adjusted to such wavelength of the incoming signal.

In another embodiment, in case the incoming signal is detected, the linewidth of the laser is decreased;
the laser is locked onto the incoming signal.

Hence, when the scanning process reveals an incoming signal, the linewidth may again be decreased (e.g., no longer be broadened) and the laser of the optical component can be locked onto the incoming signal, i.e. the wavelength of the laser is chosen (or adjusted) such that it locks onto the wavelength of the incoming signal.

Hence, the (previously) broadened linewidth of the laser can be used to determine an incoming signal in an accelerated manner and to lock onto such signal.

The incoming signal may be a signal received from an OLT and the optical component may be an ONU.

In a further embodiment, the scanning speed is reduced before the laser is locked onto the incoming signal.

Hence, once a signal is detected, the scanning speed can be reduced, in particular together with the decrease of the linewidth of the laser.

In a next embodiment, a wavelength of the laser is fine-tuned before the laser is locked onto the incoming signal.

Such fine-tuning or fine-adjustment is an optional step to adjust the wavelength of the laser to correspond to the wavelength of the incoming signal. It depends on the respective laser and scenario whether or not such step of fine-tuning may be favorable.

It is also an embodiment that the linewidth of the laser is broadened by swiftly modulating a bias current of the laser.

Pursuant to another embodiment, the linewidth of the laser is broadened by mechanical modulation of a component of the laser.

According to an embodiment, the component of the laser is a mirror of the laser, wherein such mirror can be modulated via a piezoelectric actuator or a micro electromechanical system.

According to another embodiment, the component of the laser is a mechanical tuning element, in particular a dielectric filter of the laser.

In yet another embodiment, the linewidth of the laser is broadened by increasing the laser's current such that the laser enters a multimode.

According to a next embodiment, the linewidth of the laser is broadened by not compensating vibrations.

Hence, during the scanning process, vibrations may not be compensated thereby broadening the linewidth of the laser.

Pursuant to yet an embodiment, the linewidth of the laser is broadened by setting the laser's current below a determined threshold such that the laser serves as broadband light source and wherein a tunable external cavity of the laser is modified in particular by a dielectric filter.

It is noted that such determined threshold may be set pursuant to a characteristic curve determined for the particular laser.

According to another embodiment, the optical component is an optical network unit or an optical line terminal.

In a particular scenario, the optical component may be an optical network unit (ONU) connected towards an OLT. The OLT provides a downstream signal that is to be detected by the ONU during the scanning process as described.

The problem stated above is also solved by an optical element comprising
a local oscillator laser,
a processing unit that is arranged
for broadening a linewidth of the local oscillator laser in particular during a scanning process.

It is noted that the embodiments described above applies in an analogue manner to the optical element.

The optical element may be an ONU or an OLT.

The problem stated supra is further solved by an optical communication system comprising at least one optical element as described herein.

Embodiments of the invention are shown and illustrated in the following figures:

DESCRIPTION OF THE INVENTION

The solution provided solves the problem of a slow scanning speed in particular by spectrally broadening the local oscillator laser during the scan process.

While no signal is detected, the linewidth of the laser is broadened in particular to a maximum value feasible. This significantly accelerates the scan speed.

When a signal is being detected, the linewidth of the laser is decreased and the scan speed is decreased so that the local oscillator (LO) laser's linewidth may reach the procedure of the usual scan with small linewidth. However, according to this solution, the LO laser approaches the actual channel in a much faster manner compared to scanning the spectrum with the linewidth of the LO laser's wavelength.

Hence, as the linewidth of the LO laser approaches the linewidth of the downstream wavelength, the overlap of the two laser signals increases (because the line narrows) and the strength of the signal increases. When the target linewidth is reached, a fine adjustment can be performed, if this is deemed necessary. Hence, the channel locks onto the downstream wavelength.

Figure 5:
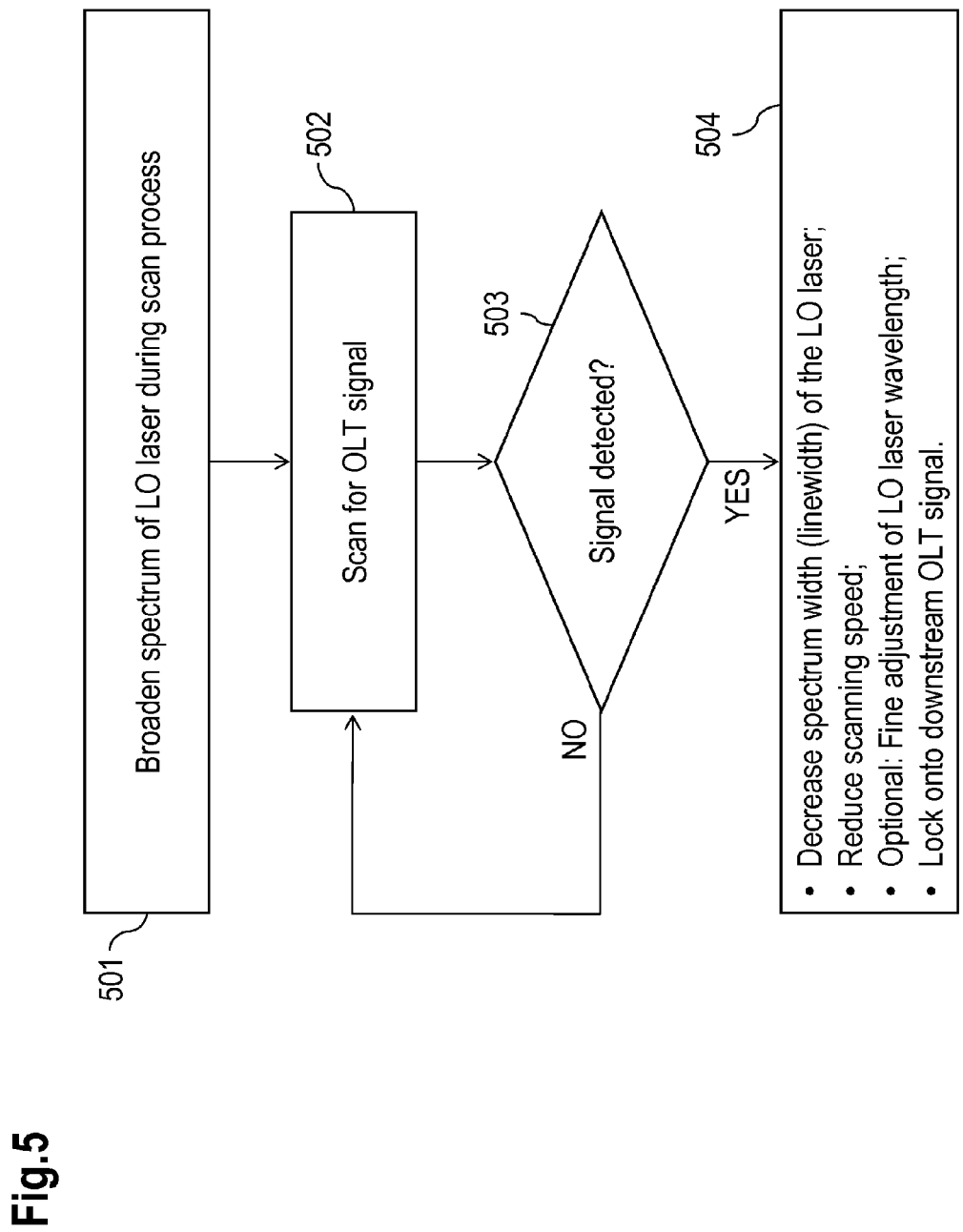
FIG. 5 shows a schematic block diagram of an optimized scanning process to adjust a wavelength of a LO laser to an OLT signal.

FIG. 5 comprises a schematic block diagram visualizing the aforementioned steps. In a step 501, the LO laser spectrum (linewidth) is broadened during the scanning process. In a step 502, the broadened LO laser signal is used for scanning for an OLT signal. In case the signal is detected (see step 503), it is branched to a step 504. Otherwise, the scanning of step 502 is continued. In said step 504, the spectrum (linewidth) of the LO laser is decreased and the scanning speed is reduced. As an option, a fine adjustment of the LO laser wavelength can be conducted to lock onto the wavelength of the downstream OLT signal.

Figure 6:
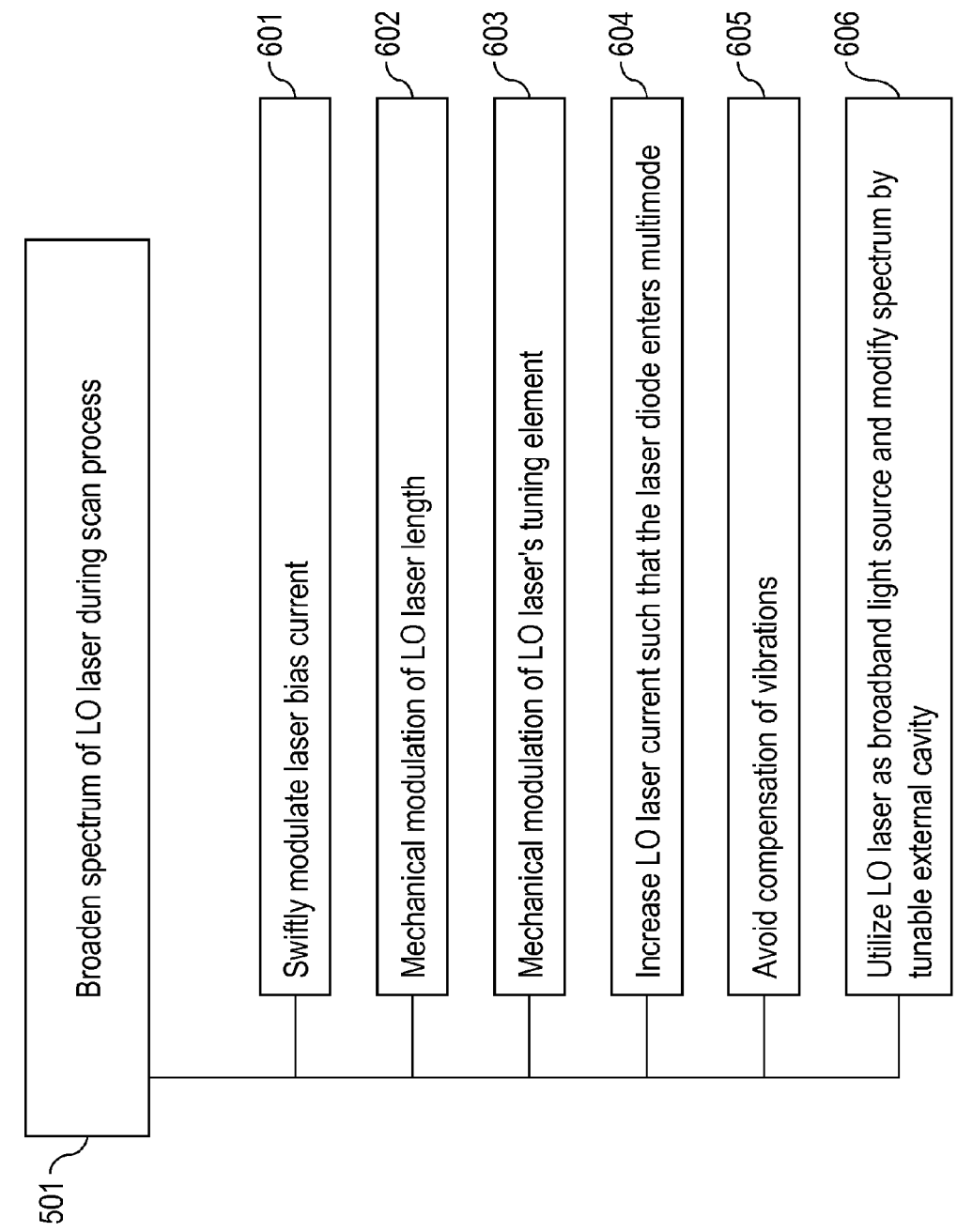
FIG. 6 shows a schematic diagram visualizing several options as how to broaden the spectrum of the LO laser during scanning.

There are various alternatives that allow for broadening the spectrum of a laser. These alternatives may be in particular as described hereinafter. The alternatives may be used separately or in combination(s) with one another. These alternatives are also visualized in FIG. 6.

(1) The frequency of the LO laser is modulated by swiftly modulating the laser bias current (see block 601). This is applicable in particular for all solid state lasers and bears the advantage that existing electronic components (laser driver) can be utilized; hence, no additional parts are required.

(2) The broadening of the laser's spectrum can be achieved by mechanical modulation (see block 602). For example, the length of the laser can be modulated by modulating a laser's mirror that is used on extended cavity lasers. This could be achieved via a piezoelectric actuator or a micro electromechanical system (MEMS) attached to one of the cavity mirrors.

This concept allows for large increases of the linewidth and is in particular useful in case tuning of the laser and is already achieved by such a mechanical actuator.

(3) Also, the broadening of the laser's spectrum can be achieved by oscillations of a mechanical tuning element such as a dielectric filter (see block 603). This method allows large variations of the linewidth of the laser's wavelength.

If the tuning mechanism allows for fast changes, this method does not require additional parts to be provided. However, it may be useful to provide a fast moving jiggle unit to efficiently broaden the laser's spectrum.

(4) The laser's current can be increased such that a laser diode of the laser enters multimode (see block 604). This approach also bears the advantage of increasing the power of the broadened signal.

(5) The laser's linewidth can be broadened by not compensating vibrations during the scan process (see block 605). This approach has the advantage that it is easy to realize and quite cost-efficient. Vibrations may increase with the scan speed, so that slowing down may automatically reduce the linewidth.

(6) The accelerated scanning procedure may comprise two parts:
 (a) Either once at ONU fabrication or every time the ONU is switched on, a characteristic curve (an optical output power in view of a driving current) of the ONU's laser is measured. The measurement device (e.g., a power detection diode) is deployed with the ONU and the laser current can be set by software so that the measurement of the characteristic curve only requires some piece of software and no additional hardware. Also, this measurement of the characteristic curve can be performed quickly. Based on this measurement a threshold current for the laser can be determined.
 (b) This threshold current information is used for an accelerated scan: The laser current is set a little (e.g., some percent) below this threshold current. The laser hence serves as a broadband light source, but its spectrum is modified by a tunable external cavity (see block 606), which is implemented by the dielectric filter and the tuning angle of such dielectric filter (see FIG. 3 and FIG. 4 and descriptions thereof below). As a consequence, the laser delivers a narrow optical spectrum, but no lasing. This narrow optical spectrum is spectrally significantly broader than the laser line and can be used for a quick scan. If an OLT wavelength is detected by an increase of the received intensity, the ONU laser current is increased above threshold and the detailed scan with reduced linewidth of the laser may start.

For implementation purposes, it may be of advantage that output power of the sub-threshold laser increased by a post amplifier. The need for such post amplifier depends on the system's characteristics. In some ONU tunable laser implementations such amplifier may be included to provide sufficient optical power to the subsequent optical stages; thus the concept suggested may efficiently utilize this amplifier without any need for additional hardware. Hence, advantageously, a large wavelength range can be scanned quickly without additional hardware effort.

It is an additional advantage that this approach detects any OLT wavelength in a reliable way. Without broadening the spectrum an OLT wavelength may be overlooked because of mode discontinuity of the ONU laser during a detailed unidirectional scan. If the ONU knows that an OLT wavelength is available in a certain wavelength window, it can take additional measures in case the regular detail scan does not find it. For example it can do a scan in reverse direction to overcome hysteresis effects or it can scan with a slightly modified laser current.

Figure 1:
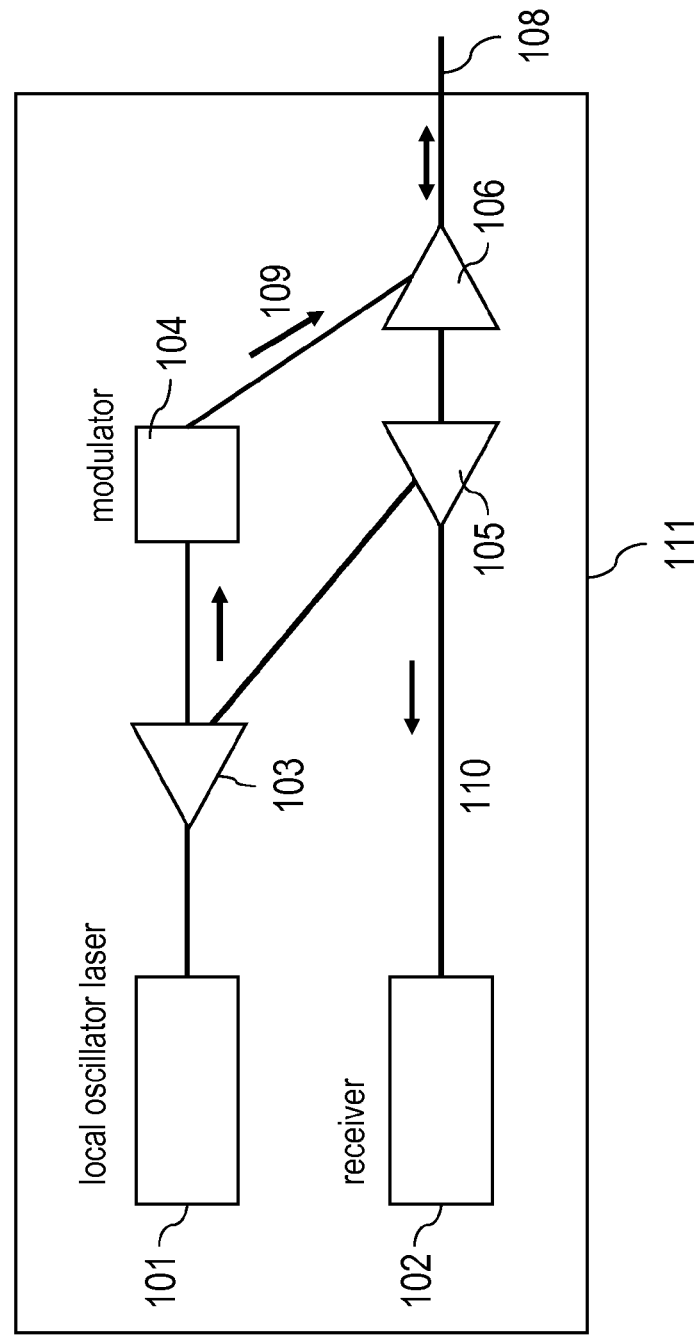
FIG. 1 shows an arrangement comprising a local oscillator laser, splitters, a modulator and a receiver, wherein such components could be part of an ONU.

FIG. 1 shows an arrangement comprising a local oscillator laser 101, splitters 103, 105 and 106, a modulator 104 and a receiver 102. These components may be part of an ONU 111. An optical fiber 108 may be connected towards an OLT (not shown).

The signal generated at the local oscillator laser 101 is modulated via the modulator 104 to produce an upstream data signal 109 to be conveyed via the optical fiber 108. An incoming optical signal via fiber 108 is fed to the receiver 102. Also the signal generated at the local oscillator laser 101 is fed via splitters 103 and 105 to the receiver 102. Hence, the local oscillator laser 101 is used for modulation purposes to transmit the signal from the ONU 111 to the OLT and for reception purposes regarding the incoming received signal 110. For the latter purpose, the wavelength of the local oscillator laser 101 needs to be adjusted to the wavelength of the incoming signal. The approach described herein allows for an accelerated scanning process in order to detect the lock onto the incoming signal within a short period of time.

Figure 2:
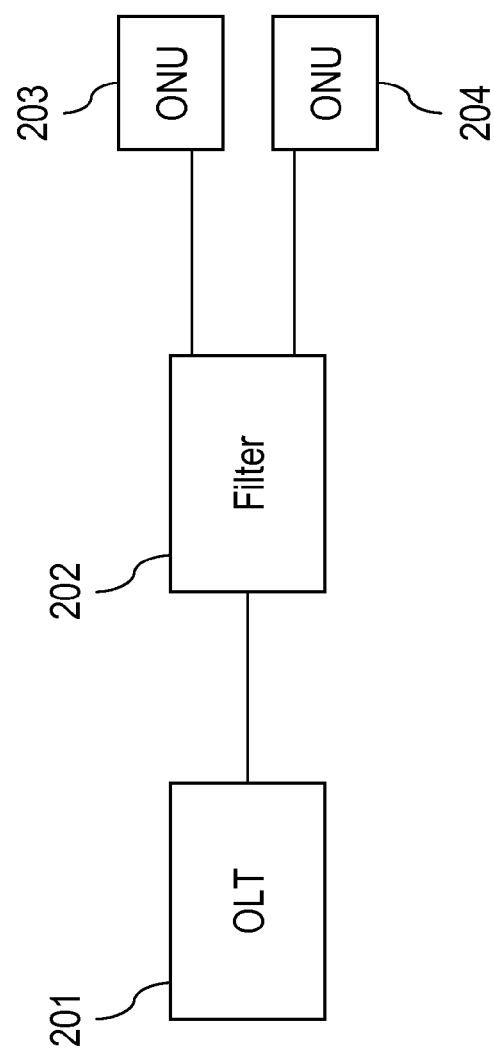
FIG. 2 shows a schematic scenario with an OLT connected via a wavelength filter towards several ONUS.

FIG. 2 shows a schematic scenario with an OLT 201 connected via a filter 202 (e.g., a wavelength filter or an AWG) towards several ONUS 203, 204. A direction from the OLT 201 towards the ONU 203, 204 is referred to as a downlink or downstream direction, whereas the opposite direction from the ONU 203, 204 towards the OLT 201 is referred to as uplink or upstream direction.

Figure 3:
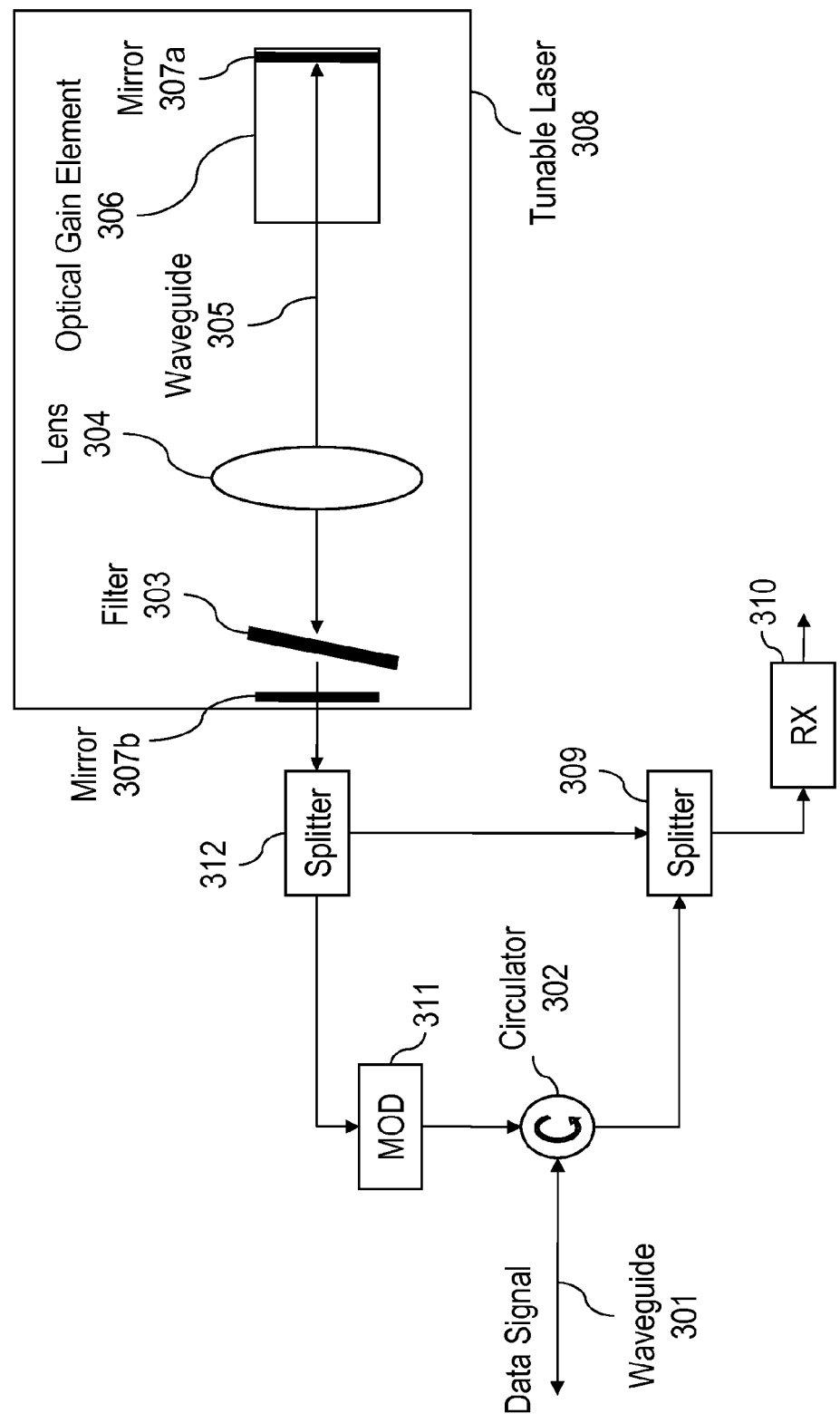
FIG. 3 shows a diagram depicting the basic principle of a filter which determines the gain profile of a local oscillator signal.

FIG. 3 shows an optical gain element 306 (e.g., a laser active medium) providing an optical signal via a waveguide 305 and a lens 304 to a filter 303, which is in particular an angle-tunable dielectric filter. The combination of said filter 303 and the optical gain element 306 comprising a mirror 307a constitutes a tunable laser 308, i.e. the tunable laser 308 can be adjusted via said filter 303. Another mirror 307b is located between the filter 303 and the output of the tunable laser 308.

The output of the tunable laser 308 is conveyed to a splitter 312, which further directs it to a modulator 311 and to another splitter 309.

Hence, the signal from the local oscillator 308 is modulated by the modulator 311 and fed to a circulator 302 that conveys the modulated signal via a waveguide 301.

On the other hand, a data signal is conveyed via the waveguide 301 to the circulator 302, which feeds the data signal towards the splitter 309 where it is combined with the signal from the tunable laser 308. This combined signal is directed to a local receiver 310 for further processing purposes.

It is a further advantage that an integrated photonic circuit can be used thus gaining receiver sensitivity.

The arrangement shown in FIG. 3 can be provided with an optical network component, e.g., with an OLT or an ONU.

Figure 4:
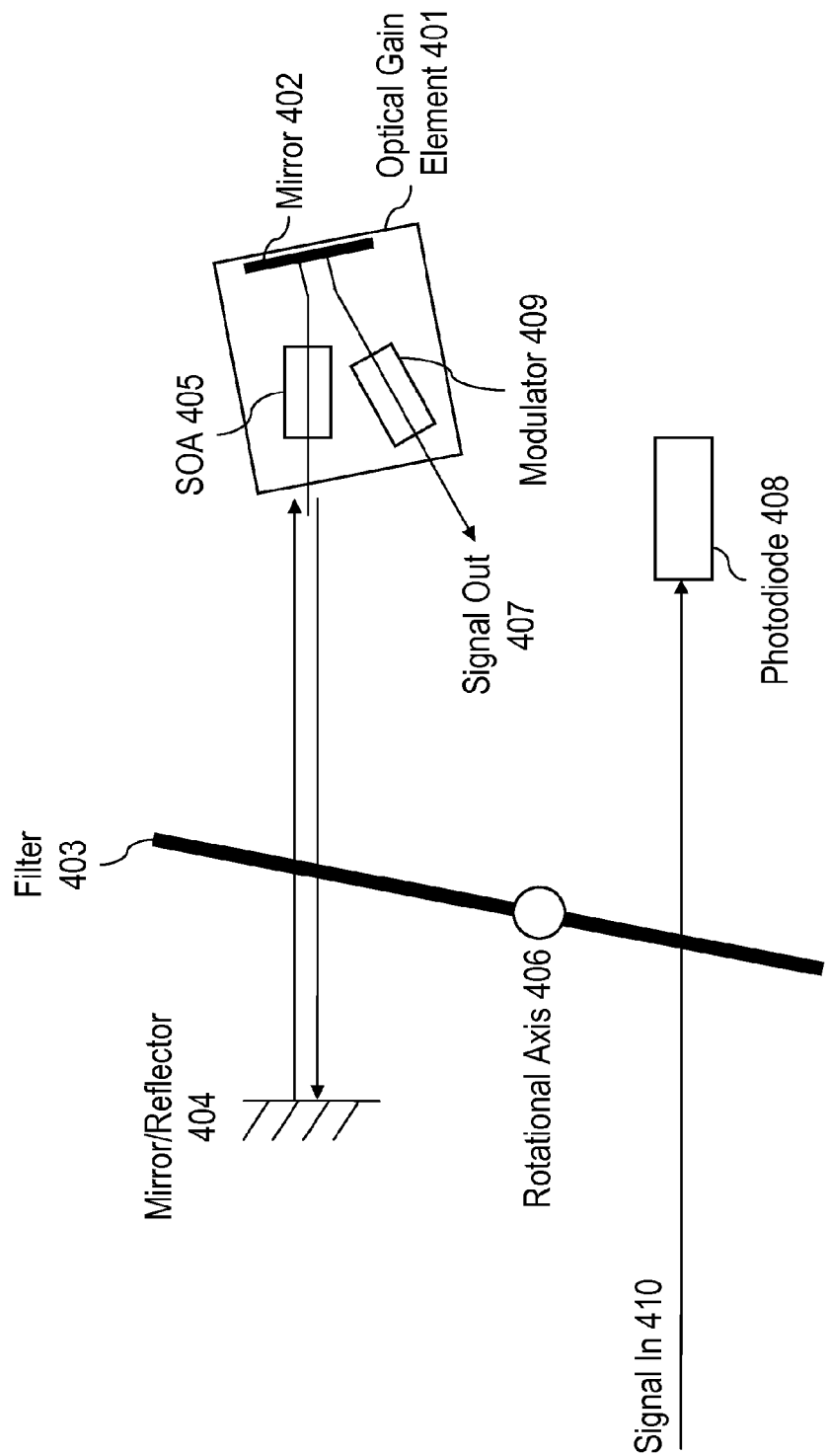
FIG. 4 shows an alternative embodiment as how an incoming and an outgoing signal may be influenced by a single tunable element, e.g., a filter.

FIG. 4 shows an exemplary arrangement as how an incoming and an outgoing signal may be influenced by a single tunable element, e.g., a filter.

An optical gain element 401 comprises a Semiconductor Optical Amplifier (SOA) 405 via which a signal is being conveyed towards a filter 403 and reflected by a mirror (or reflector) 404 back to the optical gain element 401. Hence, the filter 403 can be used to adjust a wavelength of a laser. The optical gain element 401 comprises a mirror 402 that is used to reflect the incoming signal from the filter 403 to be modulated by a modulator 409 and provided as an output signal "Signal Out" 407.

It is noted that the optical gain element may be a laser diode comprising an anti-reflection coating.

In addition, an input signal (data signal, "Signal In" 410) can be fed via the filter 403 to a photodiode 408.

LIST OF ABBREVIATIONS

AC Alternating Current
DC Direct Current
LO Local Oscillator
OAN Optical Access Network
OLT Optical Line Terminal
ONU Optical Network Unit
UDWDM Ultra-Dense WDM
WDM Wavelength Division Multiplex

The invention claimed is:

1. A method of operating a laser in an optical component, which method comprises the following steps:
providing the laser as a local oscillator of a coherent receiver of the optical component; broadening a linewidth of the laser, and
scanning for an incoming signal utilizing the broadened linewidth of the laser.

2. The method according to claim 1, which comprises, in case the incoming signal is detected:
decreasing the linewidth of the laser; and
locking the laser onto the incoming signal.

3. The method according to claim 2, which comprises reducing a scanning speed prior to locking the laser onto the incoming signal.

4. The method according to claim 2, which comprises fine-tuning a wavelength of the laser prior to locking the laser onto the incoming signal.

5. The method according to claim 1, wherein the step of broadening the linewidth of the laser comprises swiftly modulating a bias current of the laser.

6. The method according to claim 1, wherein the step of broadening the linewidth of the laser comprises a mechanical modulation of a component of the laser.

7. The method according to claim 6, wherein the component of the laser is a mirror of the laser, and wherein the mirror can be modulated via a piezoelectric actuator or a micro electromechanical system.

8. The method according to claim 6, wherein the component of the laser is a mechanical tuning element.

9. The method according to claim 8, wherein the component of the laser is a dielectric filter of the laser.

10. The method according to claim 1, wherein the step of broadening the linewidth of the laser comprises increasing a laser current such that the laser enters a multimode.

11. The method according to claim 1, wherein the step of broadening the linewidth of the laser comprises not compensating vibrations.

12. The method according to claim 1, wherein the step of broadening the linewidth of the laser comprises setting a laser current below a determined threshold such that the laser serves as broadband light source and modifying a tunable external cavity of the laser.

13. The method according to claim 12, wherein the tunable external cavity of the laser is modified by a dielectric filter.

14. The method according to claim 1, wherein the optical component is an optical network unit or an optical line terminal.

15. An optical element, comprising:
a local oscillator laser of a coherent receiver; and
a processing unit configured for broadening a line width of said local oscillator laser during a scanning process for an incoming signal.

16. An optical communication system, comprising at least one optical element according to claim 15.

* * * * *